United States Patent
Kim et al.

(10) Patent No.: US 12,334,359 B2
(45) Date of Patent: *Jun. 17, 2025

(54) PLASMA ETCHING METHOD

(71) Applicant: Ajou University Industry—Academic Cooperation Foundation, Suwon-si (KR)

(72) Inventors: Chang-Koo Kim, Seoul (KR); Jun-Hyun Kim, Seongnam-si (KR); Sang-Hyun You, Yongin-si (KR)

(73) Assignee: AJOU UNIVERSITY INDUSTRY—ACADEMIC COOPERATION FOUNDATION, Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/036,932

(22) PCT Filed: Jul. 28, 2021

(86) PCT No.: PCT/KR2021/009755
§ 371 (c)(1),
(2) Date: May 15, 2023

(87) PCT Pub. No.: WO2022/102909
PCT Pub. Date: May 19, 2022

(65) Prior Publication Data
US 2024/0006186 A1 Jan. 4, 2024

(30) Foreign Application Priority Data
Nov. 13, 2020 (KR) ........................ 10-2020-0151781

(51) Int. Cl.
*H01L 21/311* (2006.01)
*H01J 37/32* (2006.01)

(52) U.S. Cl.
CPC ............ *H01L 21/31116* (2013.01); *H01J 37/32449* (2013.01); *H01J 37/32522* (2013.01); *H01L 21/31122* (2013.01); *H01J 2237/334* (2013.01)

(58) Field of Classification Search
None
See application file for complete search history.

(56) References Cited

U.S. PATENT DOCUMENTS 6,514,425 B1 * 2/2003 Sekiya ............... H01L 21/3065
438/723
2007/0187362 A1 * 8/2007 Nakagawa ............... C23F 4/00
216/81

(Continued)

FOREIGN PATENT DOCUMENTS

JP 11-140441 A 5/1999
JP 2001077084 A * 3/2001

(Continued)

OTHER PUBLICATIONS

JP-2001077084 With machine translation (Year: 2001).*
International Search Report of PCT/KR2021/009755 dated Nov. 4, 2021 [PCT/ISA/210].

*Primary Examiner* — Shamim Ahmed
(74) *Attorney, Agent, or Firm* — Sughrue Mion, PLLC

(57) ABSTRACT

Disclosed is a plasma etching method. The method includes a first step of vaporizing liquid heptafluoropropyl methyl ether (HFE-347mcc3) and liquid pentafluoropropanol (PFP); a second step of supplying a discharge gas containing the vaporized HFE-347mcc3, the vaporized PFP, and argon gas to a plasma chamber in which an etching target is disposed; and a third step of discharging the discharge gas to generate plasma and of plasma-etching the etching target using the generated plasma.

5 Claims, 17 Drawing Sheets

(56) References Cited

U.S. PATENT DOCUMENTS

| | | | |
|---|---|---|---|
| 2017/0243756 A1* | 8/2017 | Matsuura | H01J 37/3244 |
| 2019/0027368 A1* | 1/2019 | Matsuura | H01L 21/31116 |
| 2020/0166836 A1* | 5/2020 | Saito | G03F 7/0002 |

FOREIGN PATENT DOCUMENTS

| | | | |
|---|---|---|---|
| KR | 10-2001-0038592 A | 5/2001 | |
| KR | 10-2020-0011767 A | 2/2020 | |
| KR | 10-2020-0018897 A | 2/2020 | |

\* cited by examiner

PLASMA ETCHING METHOD

FIELD

The present disclosure relates to a plasma etching method. More specifically, the present disclosure relates to a plasma etching method using a mixture of HFE-347mcc3 and PFP having a low global warming potential (GWP) as a discharge gas.

DESCRIPTION OF RELATED ART

In the manufacture of semiconductor devices, an etched structure with a high aspect ratio is required due to the high density of integrated circuits and miniaturization of an element. The etched structure with the high aspect ratio is mainly manufactured through plasma etching. Etching to obtain the high aspect ratio structure mainly uses perfluoro compound (PFC) plasma.

PFC gas is chemically stable, has a long average residence time in the atmosphere, and has a very high GWP of 6500 or greater times of GWP of $CO_2$. PFC gas is one of the six major greenhouse gases ($CO_2$, $CH_4$, $N_2O$, HFC, PFC, $SF_6$) and is used in various industries, especially in the semiconductor device manufacturing process.

Starting in 1999, members of the World Semiconductor Council (WSC) signed a voluntary agreement to reduce PFC gas emissions by 10% by 2010 and agreed with a 32% reduction program from 2011 to 2020 compared to that in 2010. However, as the integration of semiconductor devices increases, a proportion of the etching process increases due to the miniaturization of the structure, and thus the annual emission of PFC gas continues to increase. Efforts have been made to reduce PFC gas emission using various methods, such as decomposition, separation, and collection of emitted PFC gas. However, the use of the PFC gas with high GWP has fundamental limitations.

Currently, $CF_4$, $C_2F_6$, $C_4F_6$, and $C_4F_8$ are typical PFC gases used in the etching process of $SiO_2$, such as via hole and contact hole etching processes in the semiconductor device manufacturing process. In a hole pattern etching process, Ar is added in addition to PFC gas for anisotropic etching. During plasma etching using the PFC gas, a fluorocarbon thin film is formed on a surface of $SiO_2$ or $Si_3N_4$ due to CFx radicals. The fluorocarbon thin film serves as a source of an etchant during etching, at the same time hinders the diffusion of ions and radicals, and also plays a role in protecting a wall surface of a etch profile to determine a shape. However, in a process of etching a hole pattern structure such as a via or a contact, excessive formation of the fluorocarbon thin film causes a phenomenon such as etch stop. Thus, in order to properly control the formation of the fluorocarbon thin film, $O_2$ may be added.

To replace PFC in the semiconductor etching process, hydrofluorocarbon (HFC), hydrofluoroolefin (HFO), hydrofluoroether (HFE), fluoroalcohol, unsaturated fluorocarbon (UFC), etc. with low GWP have been used. However, the low GWP substances with etching ability which are used in place of PFC have different etching characteristics. Therefore, it is necessary to identify a factor that may provide excellent etching characteristics and select a substance based on the factor.

DISCLOSURE

Technical Purposes

One purpose of the present disclosure is to provide a plasma etching method using, as a discharge gas, a mixed gas of HFE-347mcc3 and PFP having a low global warming potential and excellent etching characteristics.

Technical Solutions

One aspect of the present disclosure provides a plasma etching method comprising: a first step of vaporizing liquid heptafluoropropyl methyl ether (HFE-347mcc3) and liquid pentafluoropropanol (PFP); a second step of supplying a discharge gas containing the vaporized HFE-347mcc3, the vaporized PFP, and argon gas to a plasma chamber in which an etching target is disposed; and a third step of discharging the discharge gas to generate plasma and of plasma-etching the etching target using the generated plasma.

In one implementation, in order to vaporize the liquid HFE-347mcc3 and the liquid PFP and then supply the vaporized HFE-347mcc3 and the vaporized PFP to the plasma chamber, a first container receiving the liquid HFE-347mcc3 therein is heated to a first temperature higher than or equal to a boiling point of the HFE-347mcc3, and a first connection pipe connecting the first container and the plasma chamber to each other is heated to a second temperature higher than the first temperature; and a second container receiving the liquid PFP therein is heated to a third temperature higher than or equal to a boiling point of the PFP, and a second connection pipe connecting the second container and the plasma chamber to each other is heated to a fourth temperature higher than the third temperature.

In one implementation, a ratio of a flow rate of HFE-347mcc3 to a sum of flow rates of HFE-347mcc3 and PFP in the discharge gas is in a range of 37.5% to 75%.

In one implementation, a ratio of the sum of the flow rates of the HFE-347mcc3 and the PFP and a flow rate of the argon gas is in a range of 1:1 to 1:3.

In one implementation, the etching target is a silicon nitride film formed on a polysilicon substrate, wherein a ratio of a flow rate of the HFE-347mcc3 to a sum of flow rates of the HFE-347mcc3 and the PFP in the discharge gas is in a range of 37.5% to 75%, wherein a ratio of the sum of the flow rates of the HFE-347mcc3 and the PFP and a flow rate of the argon gas is in a range of 1:1 to 1:3, wherein a bias voltage applied to a substrate supporting the etching target thereon is in a range of −500 V to −350 V.

Technical Effects

According to the present disclosure, when the plasma of the mixed gas of HFE-347mcc3 and PFP is used to manufacture a high aspect ratio etched structure, the diameter of the hole pattern has little change, and pattern deformation is small, such that a straighter and deeper etched structure with excellent etching selectivity can be formed. Moreover, the mixed gas of HFE-347mcc3 and PFP can replace the PFC gas which has a great global warming effect. Thus, the semiconductor manufacturing process using the mixed gas of HFE-347mcc3 and PFP is more environmentally friendly than the semiconductor manufacturing process using the existing PFC gas.

DETAILED DESCRIPTIONS

Figure 1:
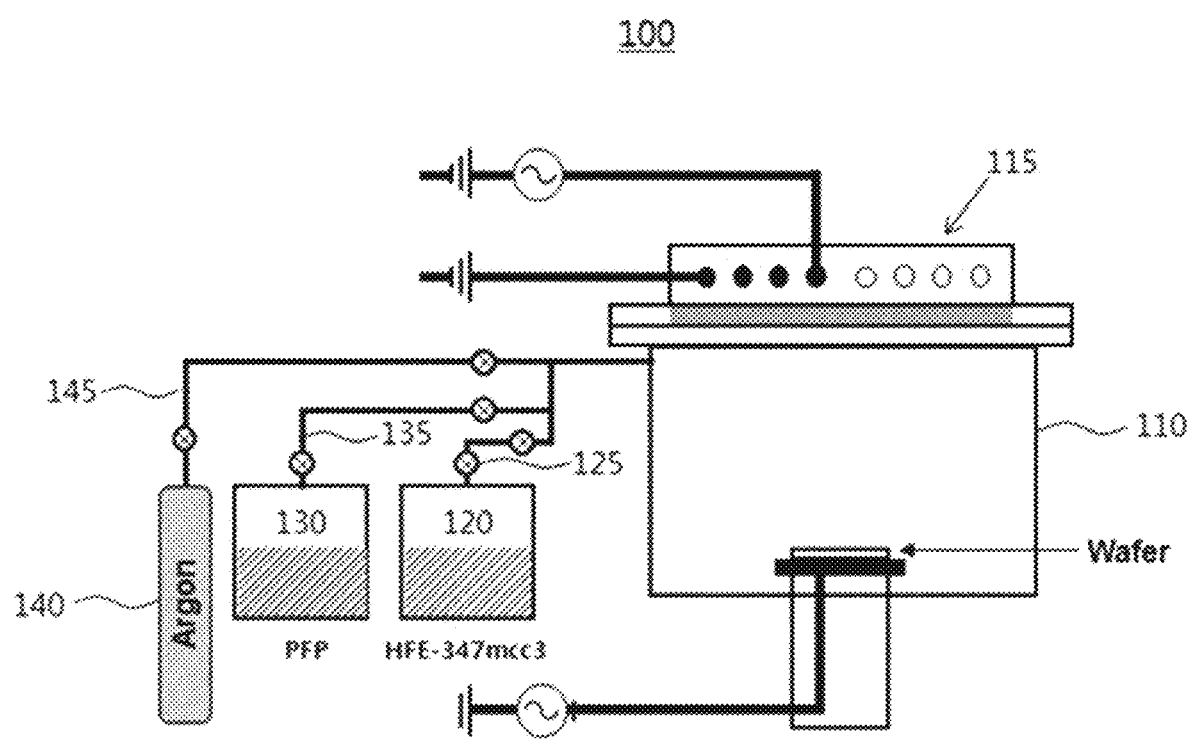
FIG. 1 is a schematic diagram of a plasma etching apparatus capable of performing a plasma etching method according to an embodiment of the present disclosure.
Figure 2A:
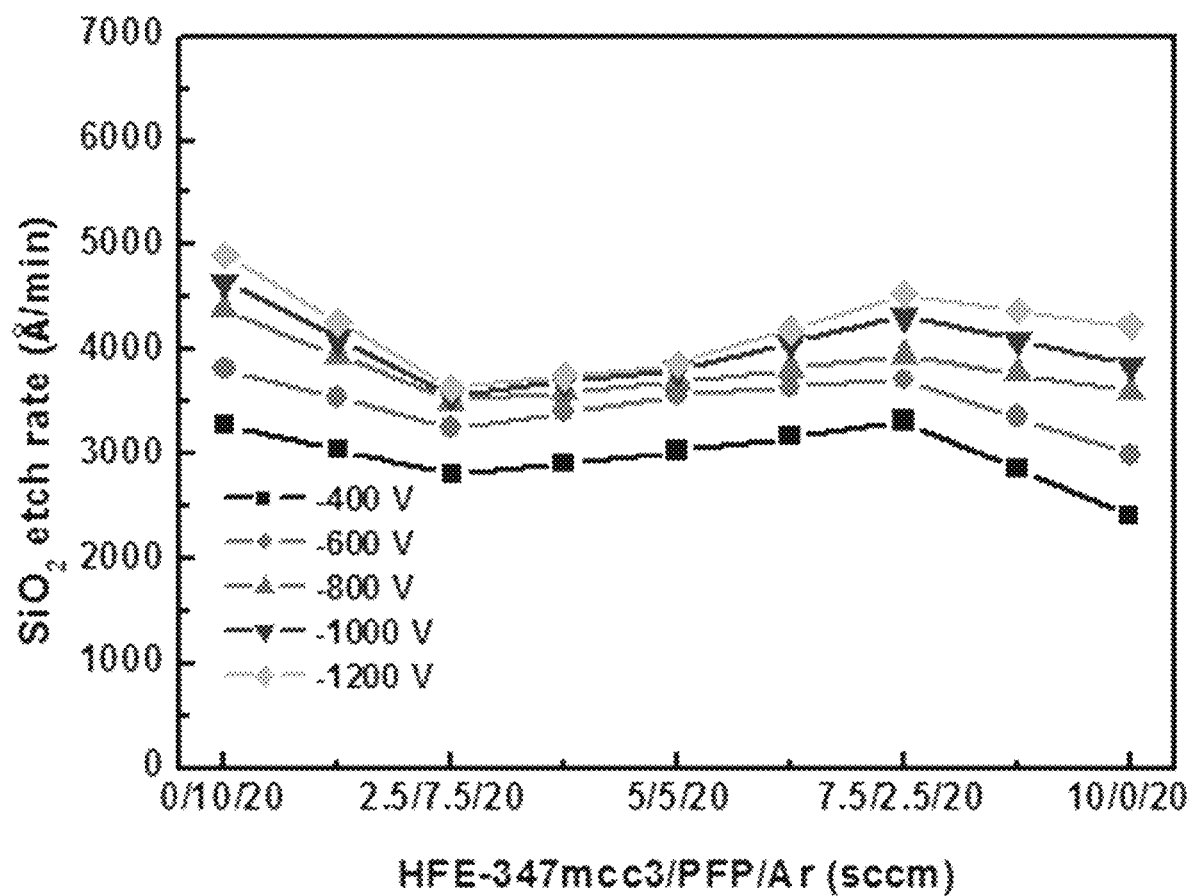
FIGS. 2A-2D are graphs showing change in the etching rate of each of a silicon oxide ($SiO_2$) layer, a silicon nitride ($Si_3N_4$) layer, a poly-silicon (poly-Si) layer, and an amorphous carbon layer (ACL) based on change in a ratio of flow rates of HFE-347mcc3/PFP/Ar under various bias voltages in plasma etching performed under conditions listed in Table 2.
Figure 2B:
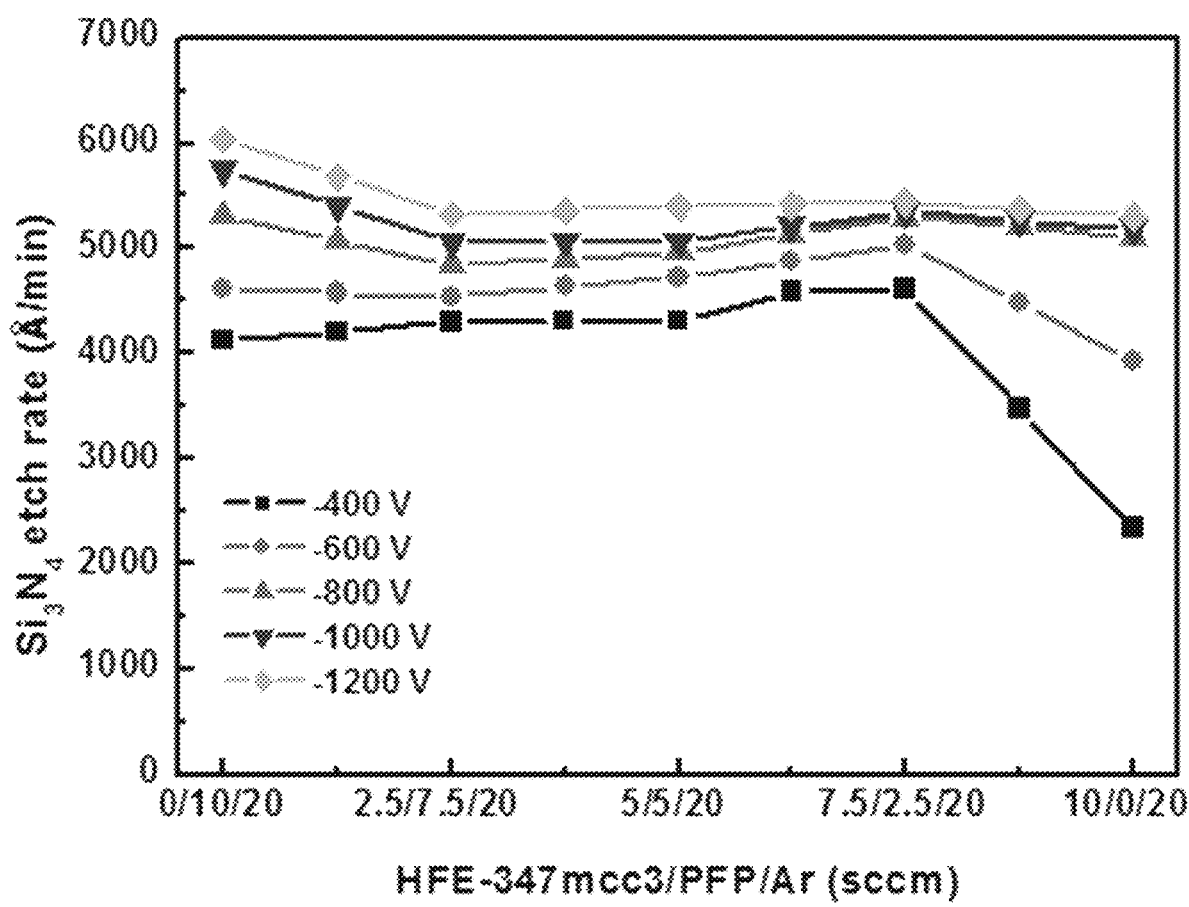
Figure 2C:
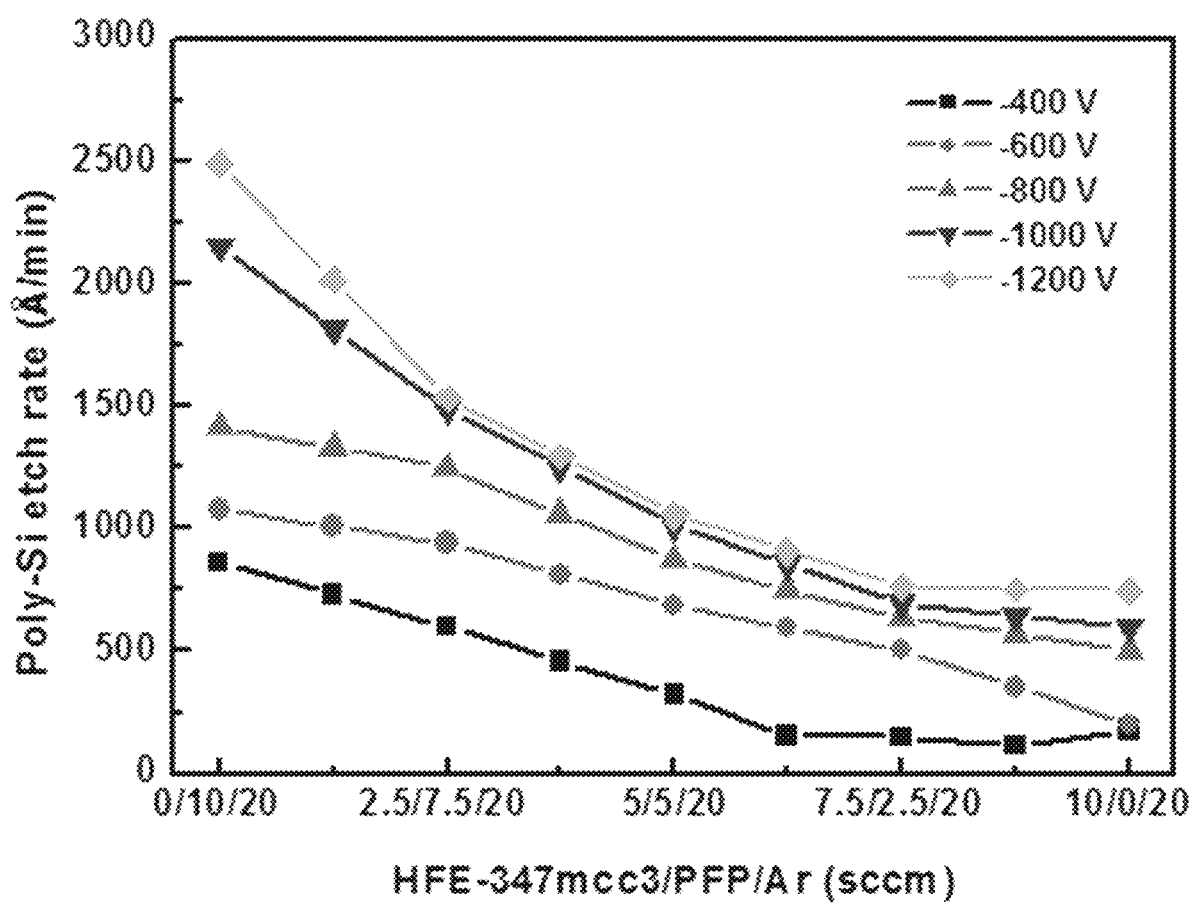
Figure 2D:
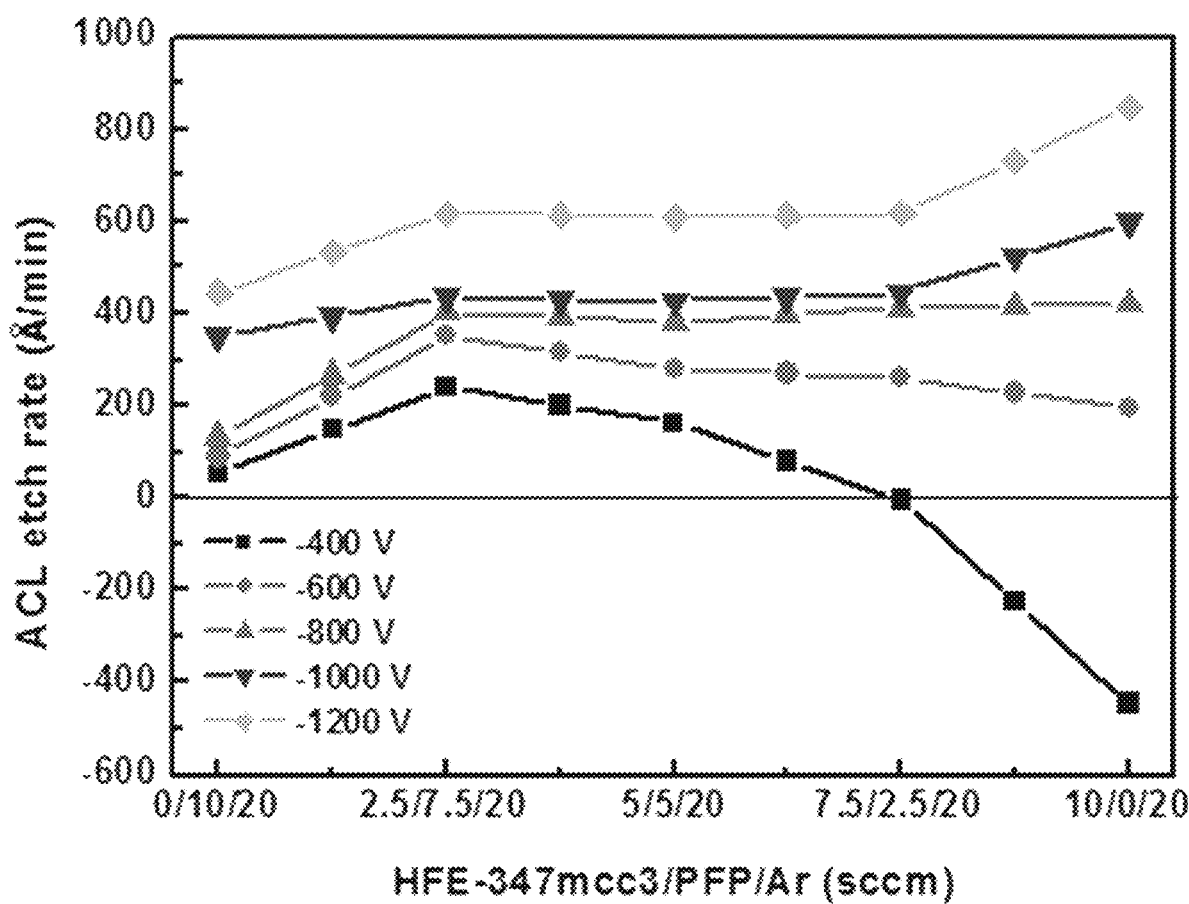

Hereinafter, embodiments of the present disclosure will be described in detail with reference to the accompanying drawings. The present disclosure may have various changes and may have various forms. Thus, specific embodiments are illustrated in the drawings and described in detail herein. However, this is not intended to limit the present disclosure to a specific disclosure form. It should be understood that the present disclosure includes all changes, equivalents, or substitutes as included within the spirit and technical scope of the present disclosure. Like reference numerals have been used for like components throughout the description of each of drawings.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "including", "include", and "including" when used in this specification, specify the presence of the stated features, integers, operations, elements, and/or components, but do not preclude the presence or addition of one or more other features, integers, operations, elements, components, and/or portions thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic diagram of a plasma etching apparatus capable of performing a plasma etching method according to an embodiment of the present disclosure.

Referring to FIG. 1, the plasma etching method according to an embodiment of the present disclosure may include a step of etching an etching target using a discharge gas containing heptafluoropropyl methyl ether (HFE-347mcc3), pentafluoropropanol (PFP), and argon gas in a plasma chamber where the etching target is disposed.

The etching target is not particularly limited, but may be made of silicon oxide or silicon nitride which constitutes an insulating layer, or polysilicon as a substrate material, or amorphous carbon as an etching mask material in a semiconductor device manufacturing process. For example, the etching target may be made of silicon oxide such as silicon dioxide.

Each of the HFE-347mcc3 and PFP is known to have the physical properties shown in Table 1 below. HFE-347mcc3 and PFP have boiling points of 34° C. and 80° C., respectively, and thus exist in a liquid state at room temperature, and have GWPs of 530 and 19, respectively, which are significantly lower than GWPs of the conventional PFC compounds.

TABLE 1

| | Heptafluoropropyl methyl ether (HFE-347mcc3) | Pentafluoropropanol (PFP) |
|---|---|---|
| Chemical Structure | (structure shown) | (structure shown) |
| Chemical name | Heptafluoropropyl methyl ether (HFE-347mcc3) | Pentafluoropropanol (PFP) |
| Cas no. | 375-03-1 | 422-05-9 |
| Molecular formula | $C_4H_2F_7O$ | $C_3H_3F_5O$ |
| Molecular weight (M.W.) (g/mol) | 200 | 150 |
| Boiling Point (° C.) | 34 | 80 |
| Density (g/mL) (25° C.) | 1.409 @ 23° C. | 1.505 @ 20° C. |
| GWP | 530 | 19 |

Referring back to FIG. 1, the plasma etching method according to the embodiment of the present disclosure may be performed using the plasma etching apparatus shown in FIG. 1. In one embodiment, a plasma etching apparatus 100 may include a plasma chamber 110, a first container 120, a second container 130, and a third container 140. The plasma chamber 110 may be coupled to a plasma source 115 and may include a discharge space receiving the etching target ('wafer') therein. The discharge space may receive the discharge gas from the first to third containers 120, 130, and 140, and the plasma source 115 may apply a discharge voltage to the discharge gas to generate plasma.

The first to third containers 120, 130, and 140 may be connected to the etching chamber 110 via first to third connection pipes 125, 135, and 145, respectively. HFE-347mcc3 in a liquid state may be received in the first container 120, PFP in a liquid state may be received in the second container 130, and argon gas may be received in the third container 145.

Heptafluoropropyl methyl ether (HFE-347mcc3) may be received in the first container 120. HFE-347mcc3 has a boiling point of about 34° C. and thus exists in a liquid phase at room temperature. Thus, in order to uniformly introduce the liquid HFE-347mcc3 into the plasma chamber 110, the HFE-347mcc3 may be vaporized and then be may be provided into the discharge space of the etching chamber 110. In one embodiment, the vaporization of the HFE-347mcc3 may be performed by heating the first container 120 receiving therein the liquid HFE-347mcc3, and the connection pipe 125 connecting the first container 120 to the etching chamber 110 to a temperature higher than the boiling point of the HFE-347mcc3. For example, in order to prevent splashing of droplets, the first container 120 may be heated to a temperature of about 50 to 80° C., and the first connection pipe 125 may be heated to a temperature of about 85 to 140° C.

Pentafluoropropanol (PFP) may be received in the second container 130. The PFP has a boiling point of about 80° C. and thus exists in a liquid state at room temperature. Thus, in order to uniformly introduce the liquid PFP into the plasma chamber 110, the PFP may be vaporized and then provided to the discharge space of the etching chamber 110. In one embodiment, the vaporization of the PFP may be performed by heating the second container 130 receiving the liquid PFP therein, and the second connection pipe 135 connecting the second container 130 and the etching chamber 110 to a temperature above the boiling point of the PFP. For example, in order to prevent splashing of droplets, the second container 130 may be heated to a temperature of about 85 to 110° C., and the second connection pipe 135 may be heated to a temperature of about 115 to 140° C.

The heating of the first and second containers 120 and 130 and the first and second connection pipes 125 and 135 may be performed by an additional external device, for example, using a heating jacket. However, the heating device is not necessarily limited thereto, and any device capable of heating the container and the connecting pipe may be used as the heating device.

In one example, a mass flow controller may be additionally installed at an outlet of each of the first and second connection pipes 125 and 135. The mass flow controller may allow each of the vaporized HFE-347mcc3 and PFP to be fed to the discharge space of the etching chamber 110 at a constant flow rate.

The argon gas received in the third container 140 may be supplied to the discharge space of the etching chamber 110 through the third connection pipe 145 different from the first and second connection pipes 125 and 135.

The argon gas as a dilution gas together with the vaporized HFE-347mcc3 and PFP may be supplied into the plasma chamber. The argon gas may increase the plasma density and may perform anisotropic etching on the etching target via ion bombardment.

In one embodiment, a ratio of a flow rate of HFE-347mcc3 to a sum of flow rates of HFE-347mcc3 and PFP in the discharge gas may be in a range of about 37.5% to 75%. When the ratio of the flow rates of the HFE-347mcc3 and the PFP is within the above range, a ratio ($CF_2$/F radical ratio) of $CF_2$ radicals to F radicals generated in the discharge plasma may be significantly reduced compared to that when the ratio of the flow rates of the HFE-347mcc3 and the PFP is out of the above range. As a result, the anisotropic etch rate may be remarkably improved in forming a high aspect ratio hole. The $CF_2$/F radical ratio may indirectly indicate a dissociation rate of a fluorocarbon precursor. In this regard, the lower the $CF_2$/F radical ratio, the higher the dissociation rate of the fluorocarbon precursor.

In one embodiment, in the discharge gas, a ratio of the sum of the flow rates of the HFE-347mcc3 and the PFP and a flow rate of argon gas may be in a range of about 1:1 to 1:3. When the ratio of the sum of the flow rates of the HFE-347mcc3 and the PFP and the flow rate of the argon gas is within the above range, not only the etch rate may be improved, but also the anisotropic etching characteristics may be improved.

In one example, the discharge gas preferably does not contain oxygen ($O_2$). When the discharge gas as a mixture of the HFE-347mcc3, the PFP, and the argon gas additionally contains oxygen ($O_2$), not only the etch rate is lowered, but also the etching selectivity is lowered, compared to those when the discharge gas does not contain oxygen ($O_2$) according to the present disclosure. This will be described later.

In one embodiment, in the plasma etching method according to an embodiment of the present disclosure, a bias voltage applied to a substrate supporting the etching target thereon may be about −350V or lower, or about −1000V or lower. For example, the bias voltage may be in a range of about −1300V to −350V or in a range of −1300 to −1000V. When the bias voltage exceeds −350V, an etch rate on the etching target may be excessively low. When the bias voltage is lower than −1300V, a problem of only increasing power consumption may occur while additional improvement of the etch rate does not occur.

In one example, in one embodiment, when etching is performed on a silicon nitride film formed on a polysilicon substrate, the discharge gas may be provided to the etching chamber 110 such that the ratio of a flow rate of HFE-347mcc3 to a sum of flow rates of HFE-347mcc3 and PFP in the discharge gas is in a range of about 37.5% to 75%, and the ratio of the sum of the flow rates of the HFE-347mcc3 and the PFP and the flow rate of argon gas is in a range of about 1:1 to 1:3, and the bias voltage applied to the substrate supporting the etching target thereon may be in a range of about −500 to −350 V. In this case, the etch selectivity may be remarkably improved compared to those under other conditions.

According to the plasma etching method of the present disclosure, while the mixed gas of HFE-347mcc3, PFP and argon (Ar) having a significantly lower GWP (Global Warming Potential) than that of the conventional PFC gas is applied as the discharge gas, the plasma etching process is performed. Thus, compared to the plasma etching process using the conventional PFC gas, emission of greenhouse gases may be significantly reduced, and excellent etching characteristics may be achieved in the plasma etching process. Moreover, when manufacturing a high aspect ratio etched structure, the etched structure with a small change in a diameter of an etched hole pattern, small pattern deformation, and excellent etching selectivity can be formed even without addition of oxygen gas.

Hereinafter, more specific Examples and experimental Examples will be described. However, the following Examples are merely some embodiments of the present disclosure, and the scope of the present disclosure is not limited to the following Examples.

EXAMPLES

Present Example

Plasma etching was performed on several thin films under various conditions using a mixed gas of HFE-347mcc3, PFP, and argon as the discharge gas. At this time, the discharge gas was supplied to the etching chamber at a flow rate of 30 sccm. In vaporizing HFE-347mcc3 and PFP and supplying the vaporized HFE-347mcc3 and PFP to the plasma chamber, the first container receiving the liquid HFE-347mcc3 therein was heated to 75° C., the first connection pipe connecting the first container and the plasma chamber to each other was heated to 90° C., the second container receiving the liquid PFP therein was heated to 100° C., and the second connection pipe connecting the second container and the plasma chamber to each other was heated to 130° C.

Comparative Example 1

Plasma etching was performed on several thin films under various conditions using a mixed gas of HFE-347mcc3, PFP, argon, and oxygen as the discharge gas. At this time, the discharge gas was provided to the etching chamber at a flow rate of 30 sccm. In vaporizing HFE-347mcc3 and PFP and supplying the vaporized HFE-347mcc3 and PFP to the plasma chamber, the first container receiving the liquid HFE-347mcc3 therein was heated to 75° C., the first connection pipe connecting the first container and the plasma chamber to each other was heated to 90° C., the second container receiving the liquid PFP therein was heated to 100° C., and the second connection pipe connecting the second container and the plasma chamber to each other was heated to 130° C.

Experimental Example 1

FIGS. 2A-2D are graphs showing change in the etching rate of each of a silicon oxide ($SiO_2$) layer, a silicon nitride ($Si_3N_4$) layer, a poly-silicon (poly-Si) layer, and an amorphous carbon layer (ACL) based on change in a ratio of flow rates of HFE-347mcc3/PFP/Ar under various bias voltages in plasma etching performed under conditions listed in Table 2 below.

TABLE 2

| Source power (W) | Total flow rate (sccm) | Pressure (mTorr) | Substrate temperature (° C.) |
|---|---|---|---|
| 250 | total = 30 | 10 | 15 |

Referring to FIGS. 2A-2D, it was identified that the etching rate of each of a silicon oxide ($SiO_2$) layer, a silicon nitride ($Si_3N_4$) layer, a poly-silicon (poly-Si) layer, and an amorphous carbon layer (ACL) increased as the bias voltage increased. It was identified that in the etching of each of the silicon oxide ($SiO_2$) and the silicon nitride ($Si_3N_4$), when the bias voltage is −800V, −1000V, and −1200V, the etch rate does not change significantly even when the ratio of the flow rates of HFE-347mcc3/PFP/Ar changes. However, it was identified that in etching the silicon nitride ($Si_3N_4$), when the bias voltage is −400V and −600V, and the ratio of the flow rate of HFE-347mcc3 to the sum of the flow rates of HFE-347mcc3 and PFP in a total flow rate of 30 sccm of the discharge gas was increased to 75% or larger, the etch rate rapidly decreased.

It was identified that in etching the poly-Si layer, the etch rate decreased as the ratio of the flow rate of HFE-347mcc3 to the sum of the flow rates of HFE-347mcc3 and PFP in the discharge gas increased.

It was identified that in the etching of the amorphous carbon layer (ACL), the etch rate increased under all bias voltage conditions as the flow rate of HFE-347mcc3 increased when the ratio of the flow rate of HFE-347mcc3 to the sum of the flow rates of HFE-347mcc3 and PFP in the discharge gas is in a range of 0% to 25%. It was identified that in the etching of the amorphous carbon layer (ACL), there was little change in the etch rate under all bias voltage conditions except for the bias voltage of −400V when the ratio of the flow rate of HFE-347mcc3 to the sum of the flow rates of HFE-347mcc3 and PFP in the discharge gas is in a range of 25% inclusive to 75% inclusive. It was identified that in the etching of the amorphous carbon layer (ACL), when the bias voltage was −1000V and −1200V, the etch rate increased rapidly as the flow rate of HFE-347mcc3 increased when the ratio of the flow rate of HFE-347mcc3 to the sum of the flow rates of HFE-347mcc3 and PFP in the discharge gas exceeds 75%. When the bias voltage was −600V and 800V, there was no change in the etch rate as the flow rate of HFE-347mcc3 increased when the ratio of the flow rate of HFE-347mcc3 to the sum of the flow rates of HFE-347mcc3 and PFP in the discharge gas exceeds 75%. When the bias voltage was −400V, the etch rate rapidly decreased as the flow rate of HFE-347mcc3 increased when the ratio of the flow rate of HFE-347mcc3 to the sum of the flow rates of HFE-347mcc3 and PFP in the discharge gas exceeds 75%.

Experimental Example 2

Figure 3A:
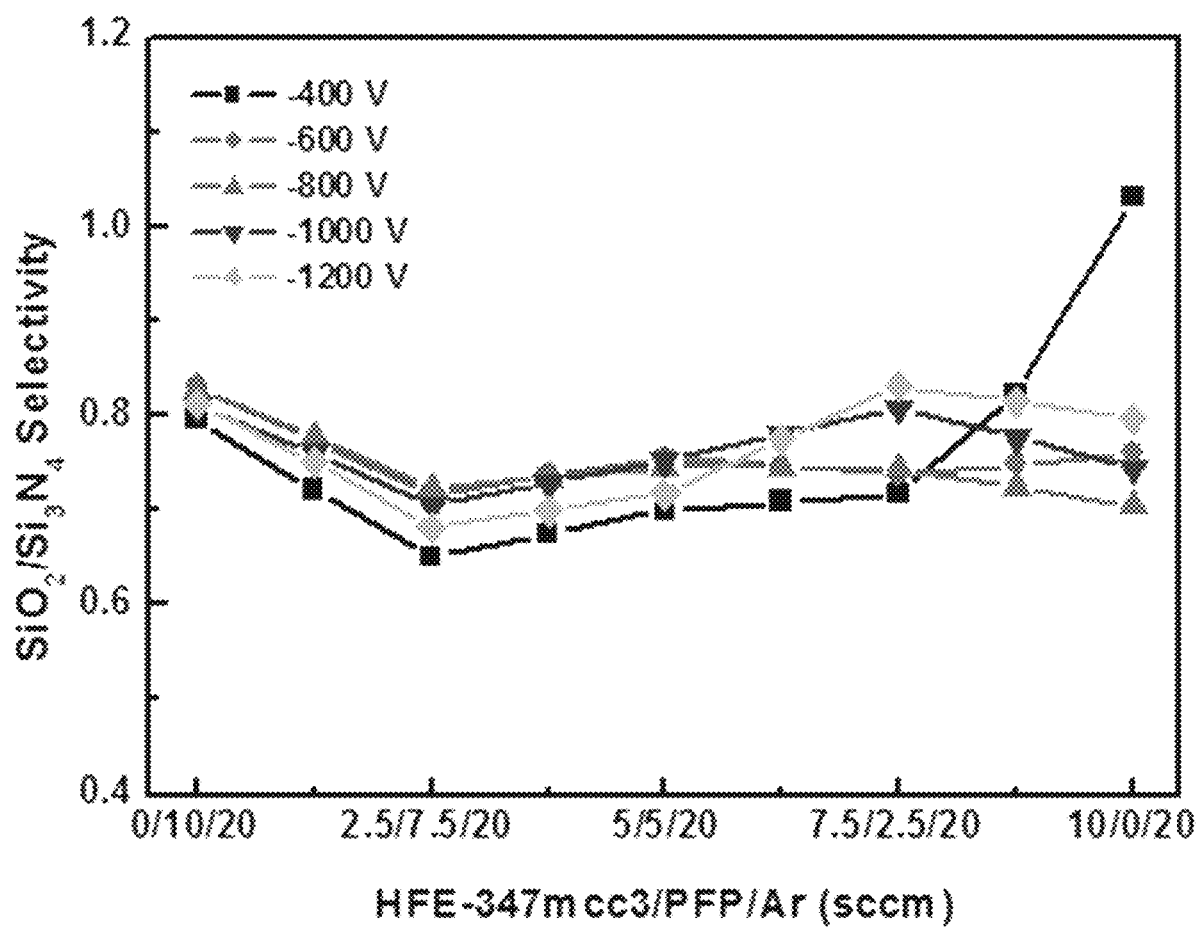
FIGS. 3A and 3B are graphs showing an etch selectivity of silicon oxide to silicon nitride ($SiO_2/Si_3N_4$ selectivity), an etch selectivity of silicon nitride to polysilicon ($Si_3N_4$/poly-Si selectivity) and an etch selectivity of silicon oxide to amorphous carbon ($SiO_2$/ACL selectivity), based on the change in a ratio of flow rates of HFE-347mcc3/PFP/Ar under various bias voltages in the plasma etching performed under the conditions as described in Table 2 above.
Figure 3B:
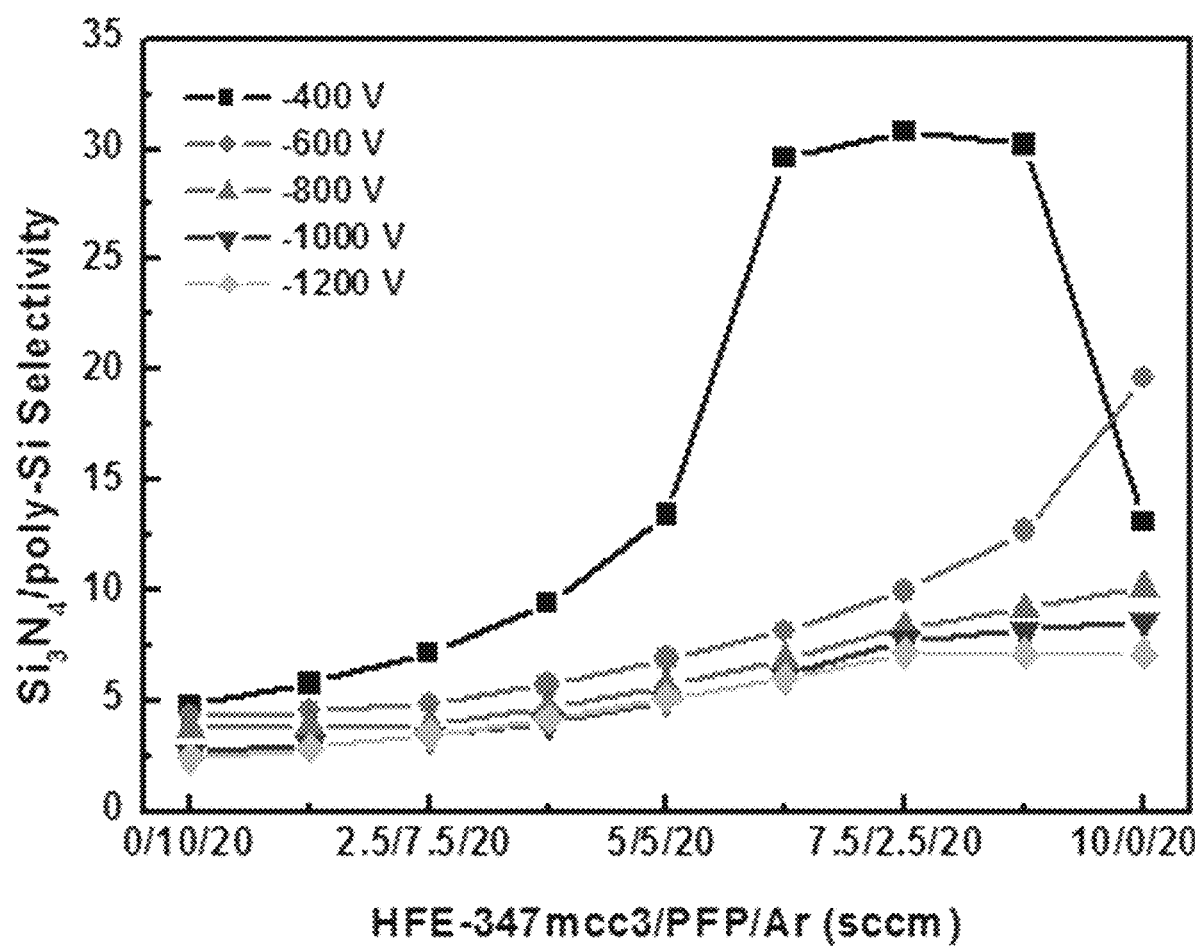
Figure 3C:
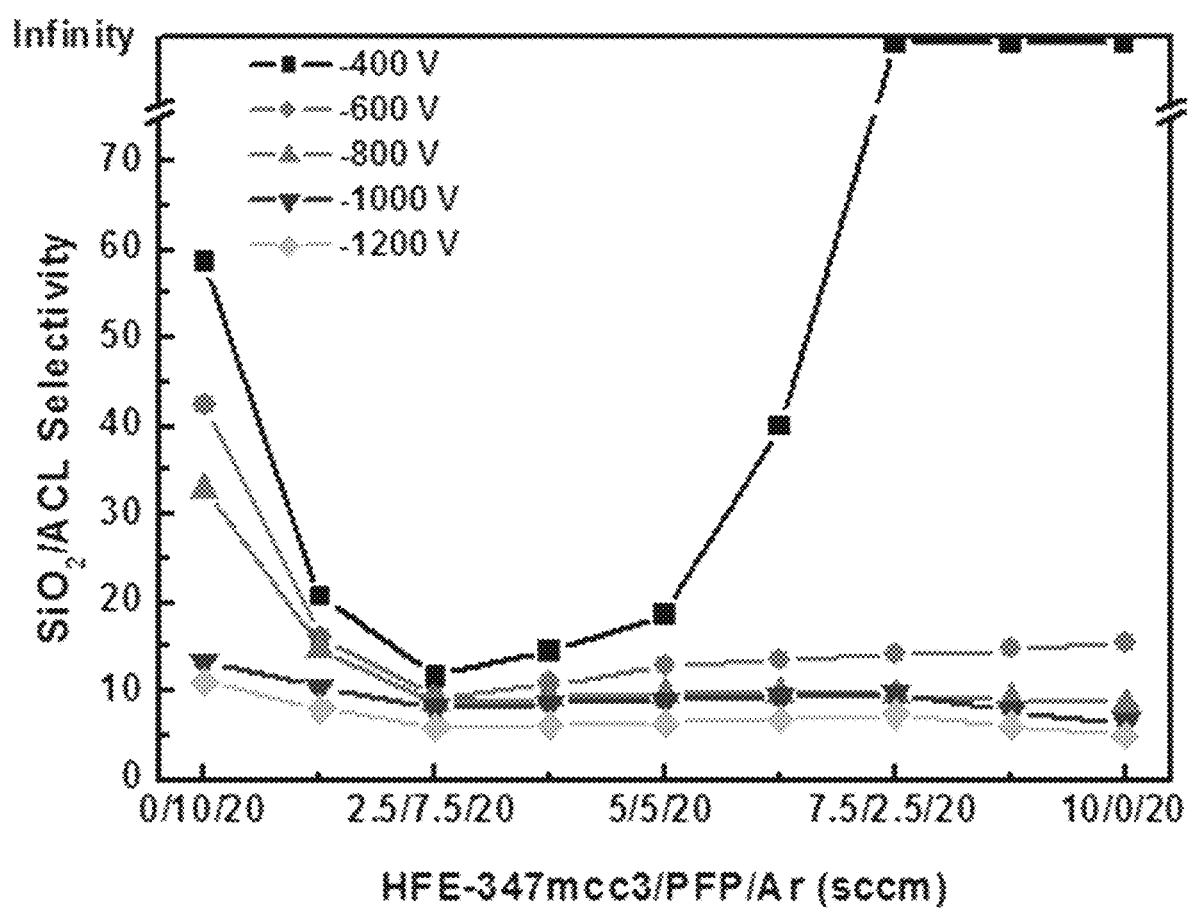

FIGS. 3A-3C are graphs showing an etch selectivity of silicon oxide to silicon nitride ($SiO_2/Si_3N_4$ selectivity), an etch selectivity of silicon nitride to polysilicon ($Si_3N_4$/poly-Si selectivity) and an etch selectivity of silicon oxide to amorphous carbon ($SiO_2$/ACL selectivity), based on the change in a ratio of flow rates of HFE-347mcc3/PFP/Ar under various bias voltages in the plasma etching performed under the conditions as described in Table 2 above.

Referring to FIGS. 3A-3C, each of the etching selectivity of $SiO_2/Si_3N_4$ and the etching selectivity of $SiO_2$/ACL was identified to be almost constant under change in the flow rate of the mixed gas at all bias voltages except −400V.

However, it was identified that the etch selectivity ($Si_3N_4$/poly-Si selectivity) of silicon nitride to polysilicon was remarkably improved when the ratio of the flow rate of HFE-347mcc3 to the sum of the flow rates of HFE-347mcc3 and PFP was in a range of 62.5% to 87.5% under the condition that the bias voltage is −400V, compared to those under other conditions. Thus, it may be identified that when etching is performed on the silicon nitride film formed on the polysilicon substrate, it is preferable from the viewpoint of the etch selectivity to provide the discharge gas to the etching chamber so that the ratio of the flow rate of HFE-347mcc3 to the sum of the flow rates of HFE-347mcc3 and PFP is in a range of 62.5% to 87.5%.

Experimental Example 3

Figure 4A:
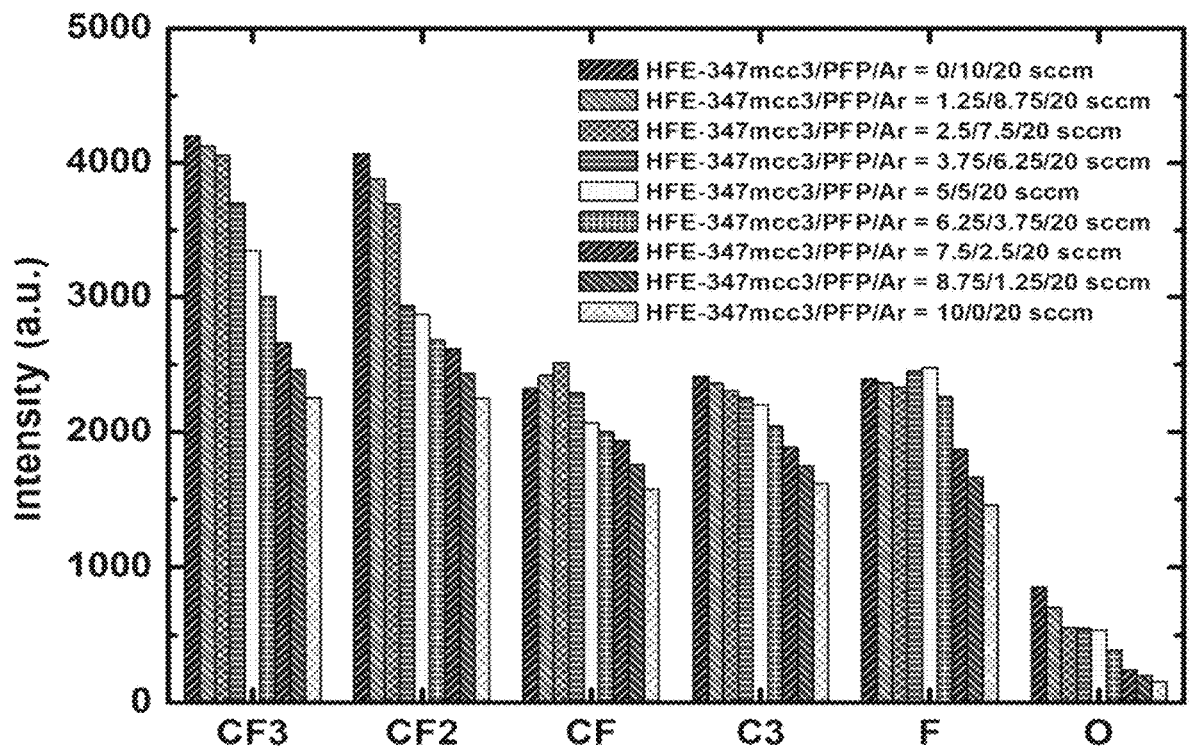
FIG. 4A is graphs showing a relative intensity of radicals measured by optical emission spectroscopy (OES) in plasma generated from the discharge gas at various ratios of flow rates of constituent gases in plasma etching performed under the conditions as listed in Table 3 below.
Figure 4A:
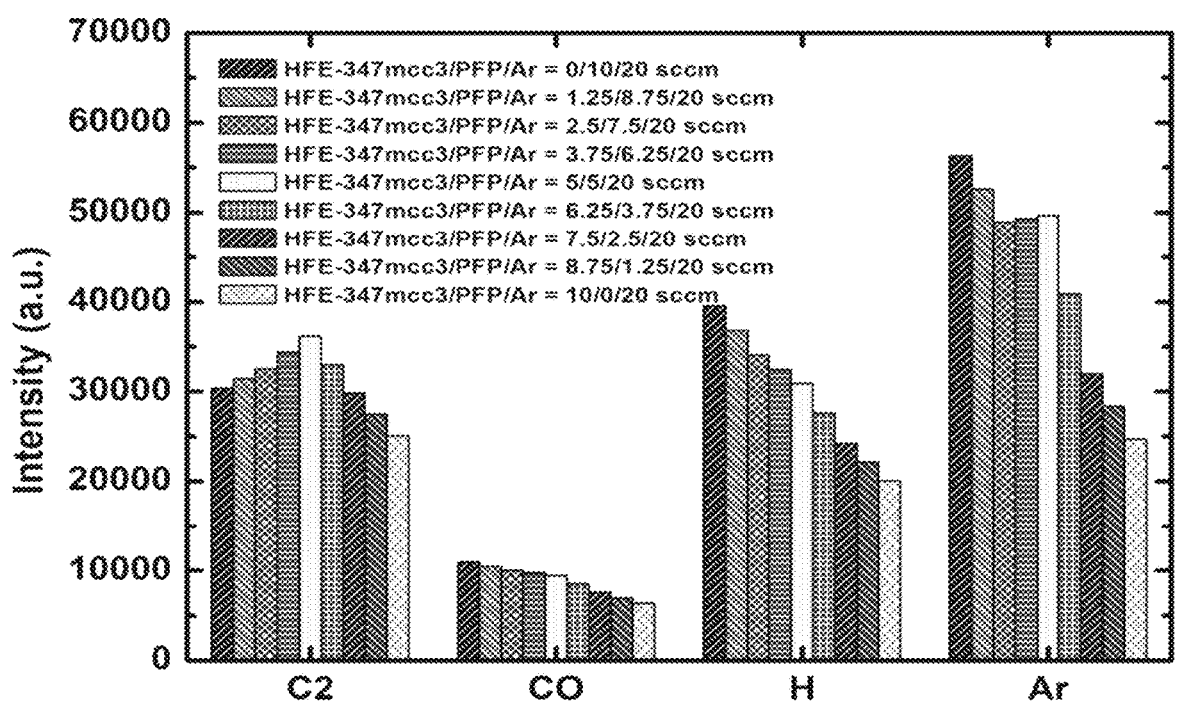
Figure 4B:
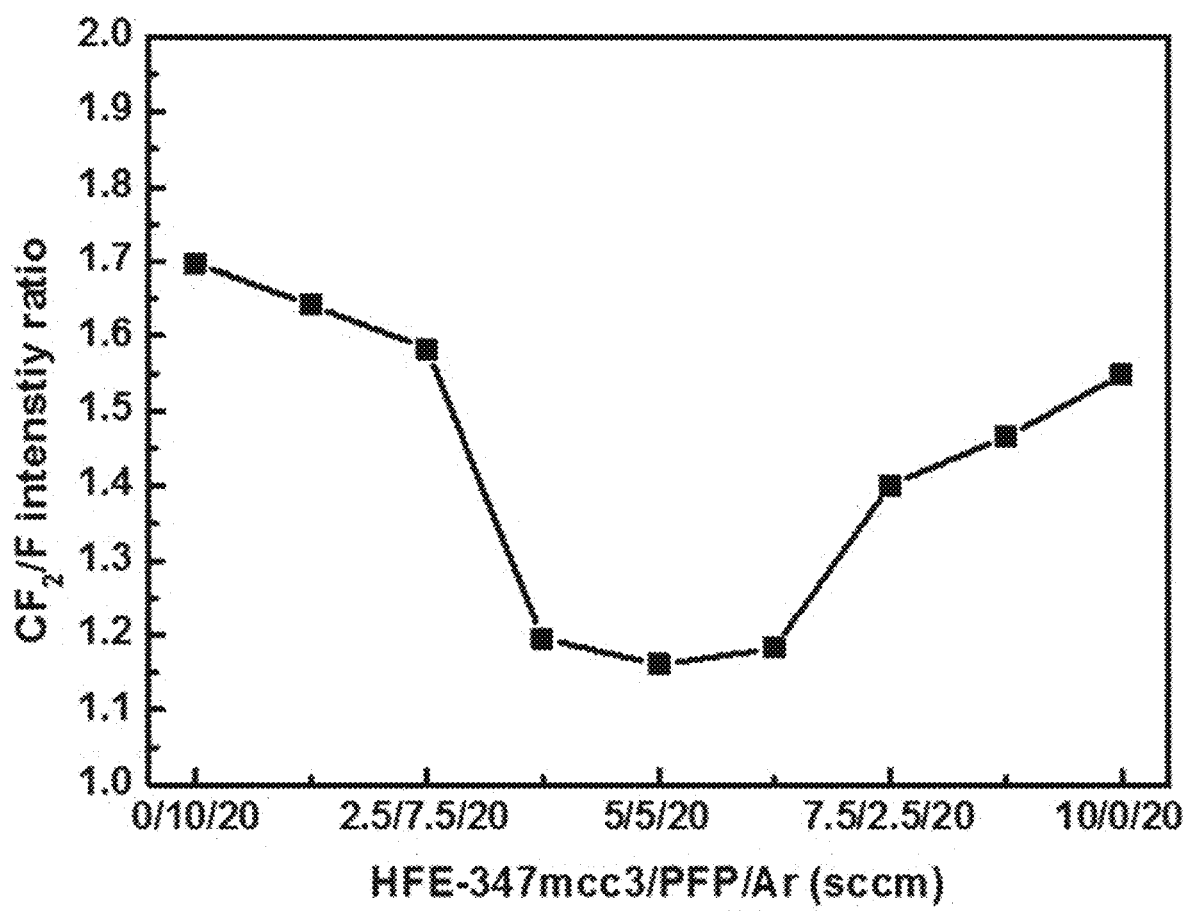
FIG. 4B is a graph showing change in a ratio of an intensity of $CF_2$ radicals to an intensity of F radicals ($CF_2$/F intensity ratio) based on various ratios of flow rates of gases constituting the discharge gas.

FIG. 4A is graphs showing a relative intensity of radicals measured by optical emission spectroscopy (OES) in plasma generated from the discharge gas at various ratios of flow rates of constituent gases in plasma etching performed under the conditions as listed in Table 3 below. FIG. 4B is a graph showing change in a ratio of an intensity of $CF_2$ radicals to an intensity of F radicals ($CF_2$/F intensity ratio) based on various ratios of flow rates of gases constituting the discharge gas.

TABLE 3

| Source power (W) | Bias voltage (V) | Discharge Gas (X/Y/Z) | Total flow rate (sccm) | Pressure (mTorr) | Substrate temperature (° C.) |
|---|---|---|---|---|---|
| 250 | −1200 | HFE-347mcc3/PFP/Ar | total = 30 | 10 | 15 |

Referring to FIG. 4A and FIG. 4B, it may be identified when a ratio of flow rates of the HFE-347mcc3/PFP/Ar changes from 0/10/20 sccm to 10/0/20 sccm, amounts of $CF_3$, $CF_2$, $C_3$, O, CO, and H radicals sequentially decrease. An amount of H radicals is the largest when the ratio of flow rates of the HFE-347mcc3/PFP/Ar is 0/10/20, and gradually decreases. It may be identified that this tendency is similar to the $Si_3N_4$ etch rate change at the bias voltage −1200V. Thus, it may be interpreted that the H radical acts as an important etching mechanism in etching $Si_3N_4$.

It was identified that the ratio of $CF_2$ radicals to F radicals ($CF_2$/F intensity ratio) was the lowest when the ratio of the flow rate of HFE-347mcc3 to the sum of the flow rates of HFE-347mcc3 and PFP in the discharge gas was in a range of about 25% to 75%. The $CF_2$/F radical ratio may indirectly indicate the dissociation rate of the fluorocarbon precursor. Thus, the lower the $CF_2$/F radical ratio, the higher the decomposition rate of the fluorocarbon precursor. As a result, it may be identified that when the ratio of the flow rate of HFE-347mcc3 to the sum of the flow rates of HFE-347mcc3 and PFP in the discharge gas is in a range of about 25% to 75%, the anisotropic etch rate is significantly improved in forming a hole with a high aspect ratio.

Experimental Example 4

Figure 5A:
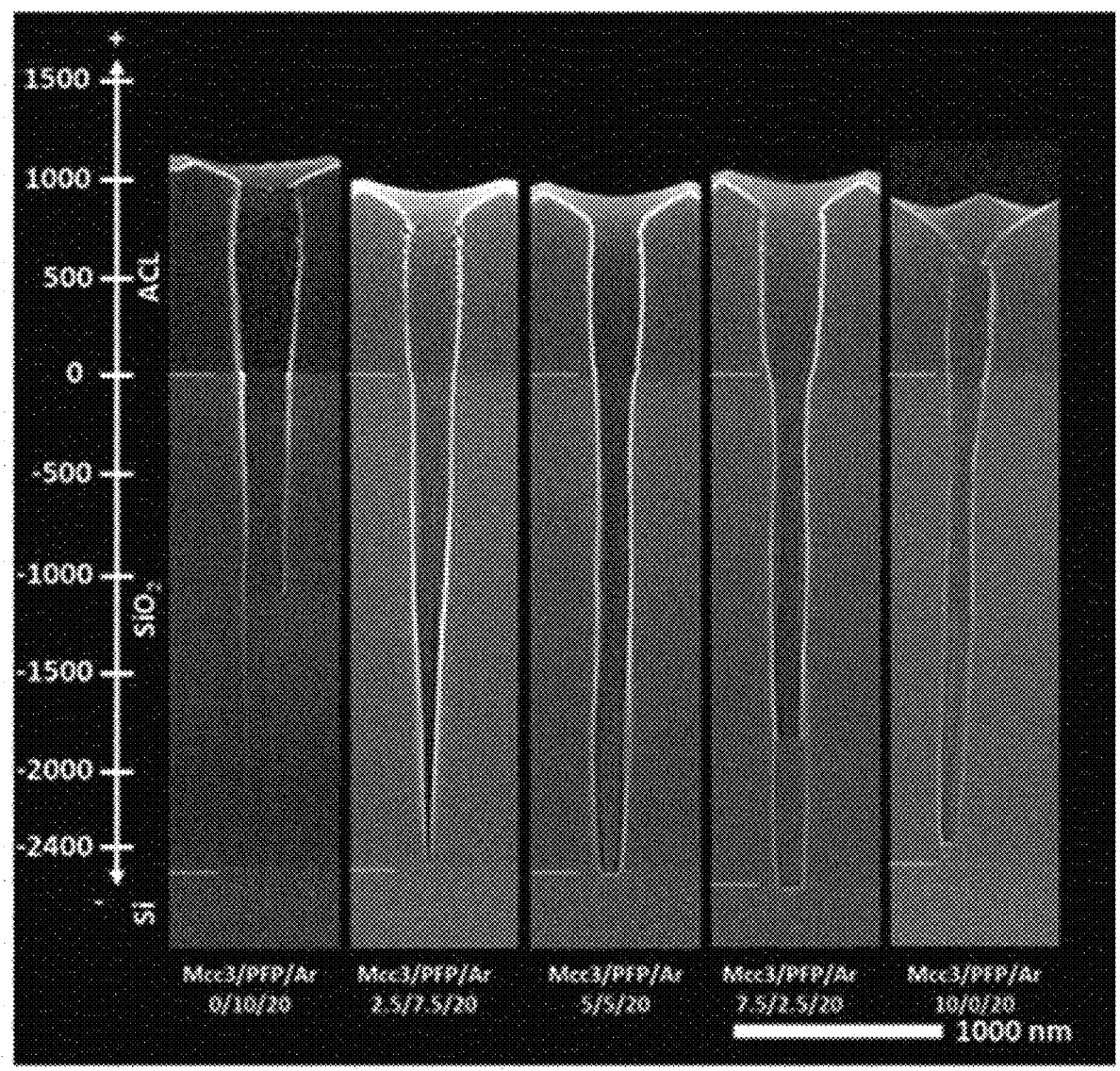
FIG. 5A are cross-sectional scanning electron microscope (SEM) images of specimens obtained by plasma-etching a silicon oxide layer using a 200 nm diameter hole-patterned ACL mask for 12 minutes respectively using plasmas generated from discharge gases in which ratios of the flow rates of HFE-347mcc3/PFP/Ar are 0/10/20, 2.5/7.5/20, 5/5/20, 7.5/2.5/20 and respectively.
Figure 5B:
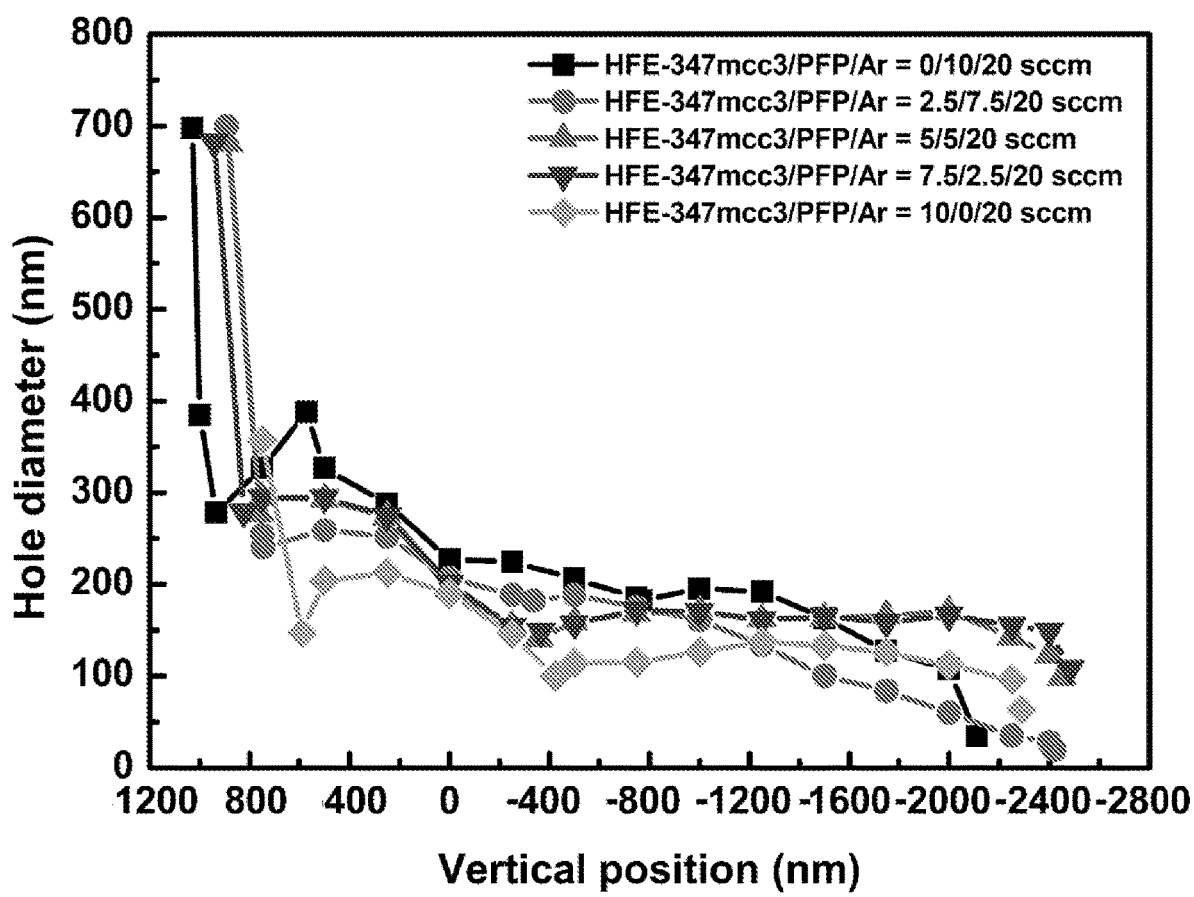
FIG. 5B is a graph measuring the change in a hole diameter along a vertical depth of each of the specimens in FIG. 5A.

FIG. 5A are cross-sectional scanning electron microscope (SEM) images of specimens obtained by plasma-etching a silicon oxide layer using a 200 nm diameter hole-patterned ACL mask for 12 minutes respectively using plasmas generated from discharge gases in which ratios of the flow rates of HFE-347mcc3/PFP/Ar are 0/10/20, 2.5/7.5/20, 5/5/20, 7.5/2.5/20 and 10/0/20, respectively. FIG. 5B is a graph measuring the change in a hole diameter along a vertical depth of each of the specimens in FIG. 5A.

TABLE 4

| Source power (W) | Bias voltage (V) | Discharge Gas (X/Y/Z) | Total flow rate (sccm) | Pressure (mTorr) | Substrate temperature (° C.) | Etching time (min) |
|---|---|---|---|---|---|---|
| 250 | −1200 | HFE-347mcc3/PFP/Ar | total = 30 | 10 | 15 | 12 |

Referring to FIG. 5A and FIG. 5B, it may be identified that when the ratio of the flow rates of HFE-347mcc3/PFP/Ar is 0/10/20 and 2.5/7.5/20, $SiO_2$ of the hole pattern is not etched, and a narrowing phenomenon occurs in which a diameter is narrowed at a lower end of an etching profile. In addition, it may be identified when the ratio of flow rates of HFE-347mcc3/PFP/Ar is 10/0/20, not only a necking phenomenon occurs in a formed hole, but also the hole diameter is non-uniform. On the other hand, it may be identified when the ratio of the flow rates of HFE-347mcc3/PFP/Ar is 5/5/20 and 7.5/2.5/20, $SiO_2$ of the hole pattern was etched and the narrowing phenomenon does not occurs, and the hole diameter is relatively uniform.

Experimental Example 5

Figure 6A:
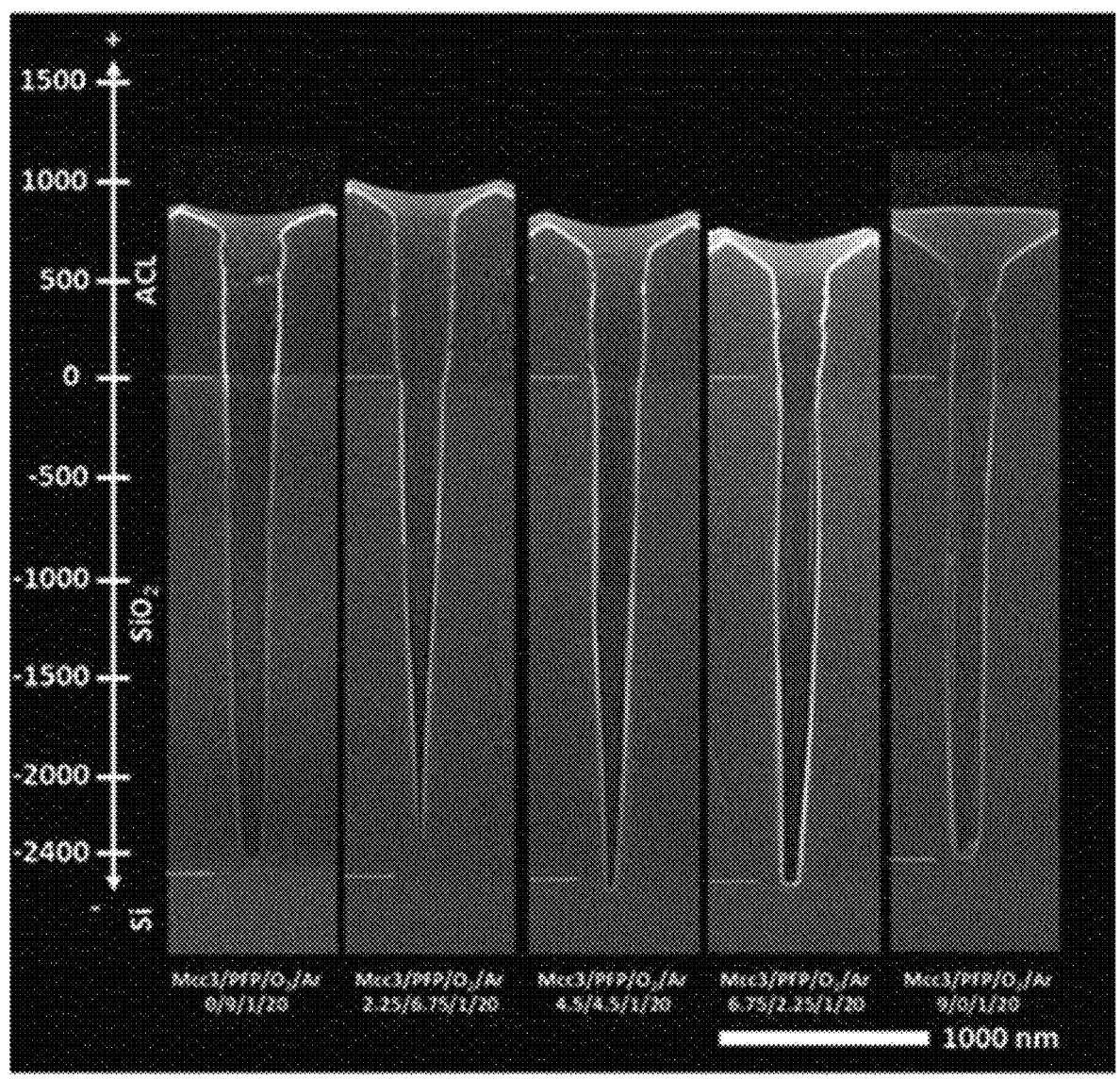
FIG. 6A are cross-sectional scanning electron microscope (SEM) images of specimens obtained by plasma-etching a silicon oxide layer using a 200 nm diameter hole-patterned ACL mask for 12 minutes respectively using plasmas generated from discharge gases in which ratios of the flow rates of HFE-347mcc3/PFP/$O_2$/Ar is 0/9/1/20, 2.25/6.75/1/20, 4.5/4.5/1/20, 6.75/2.25/1/20, and 9/0/1/20, respectively.
Figure 6B:
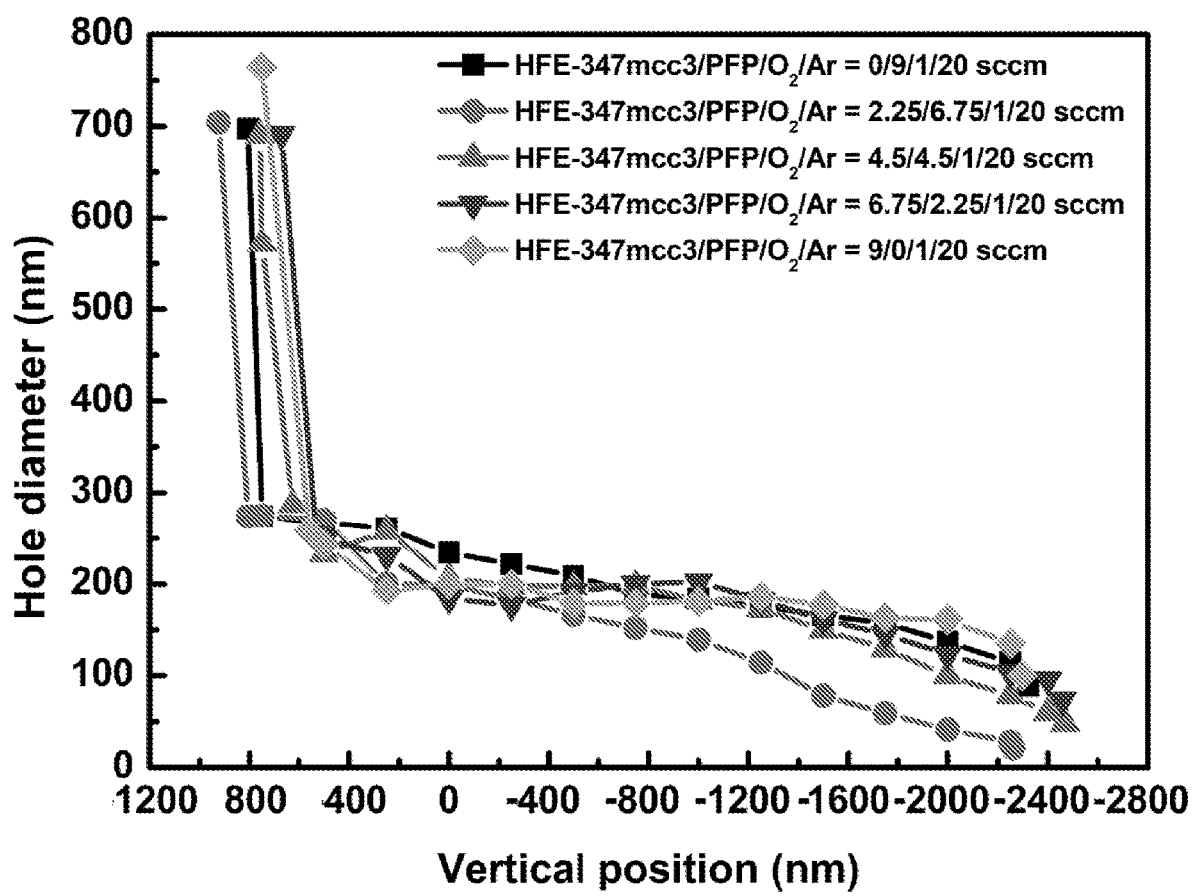
FIG. 6B is a graph measuring the change in a hole diameter along a vertical depth of each of the specimens in FIG. 6A.

FIG. 6A are cross-sectional scanning electron microscope (SEM) images of specimens obtained by plasma-etching a silicon oxide layer using a 200 nm diameter hole-patterned ACL mask for 12 minutes respectively using plasmas generated from discharge gases in which ratios of the flow rates of HFE-347mcc3/PFP/$O_2$/Ar is 0/9/1/20, 2.25/6.75/1/20, 4.5/4.5/1/20, 6.75/2.25/1/20, and 9/0/1/20, respectively. FIG. 6B is a graph measuring the change in a hole diameter along a vertical depth of each of the specimens in FIG. 6A.

TABLE 5

| Source power (W) | Bias voltage (V) | Discharge Gas (X/Y/Z) | Total flow rate (sccm) | Pressure (mTorr) | Substrate temperature (° C.) | Etching time (min) |
|---|---|---|---|---|---|---|
| 250 | −1200 | HFE-347mcc3/PFP/$O_2$/Ar | total = 30 | 10 | 15 | 12 |

Referring to FIG. 6A and FIG. 6B, compared to the specimens shown in FIG. 5A and FIG. 5B, it may be identified that in the specimens obtained by the etching using the discharge gas in which the ratio of flow rates of HFE-347mcc3/PFP/$O_2$/Ar is 0/9/1/20 and 9/0/1/20, the uniformity of the diameter along the vertical depth of the hole is improved, whereas in the specimens obtained by the etching using the discharge gas in which the ratio of flow rates of HFE-347mcc3/PFP/$O_2$/Ar is 2.25/6.75/1/20, 4.5/4.5/1/20, and 6.75/2.25/1/20, the narrowing phenomenon in the etching profile occurs more distinctly in which the diameter along the vertical depth of the hole decreases greatly as the hole extends toward a bottom.

Figure 7A:
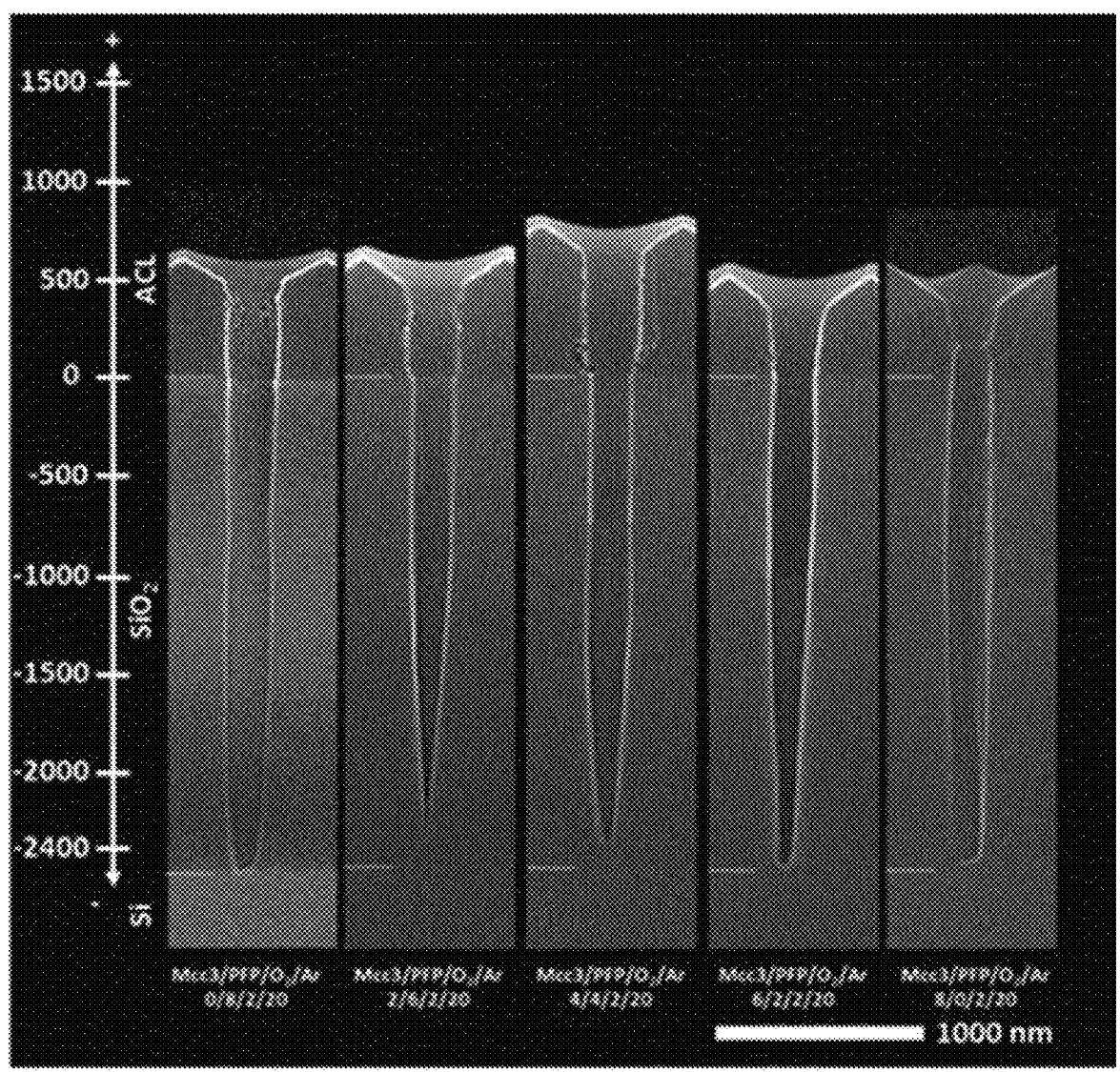
FIG. 7A are cross-sectional scanning electron microscope (SEM) images of specimens obtained by plasma-etching a silicon oxide layer using a 200 nm diameter hole-patterned ACL mask for 12 minutes respectively using plasmas generated from discharge gases in which ratios of the flow rates of HFE-347mcc3/PFP/$O_2$/Ar is 0/8/2/20, 2/6/2/20, 4/4/2/20, 6/2/2/20, and 8/0/2/20, respectively.
Figure 7B:
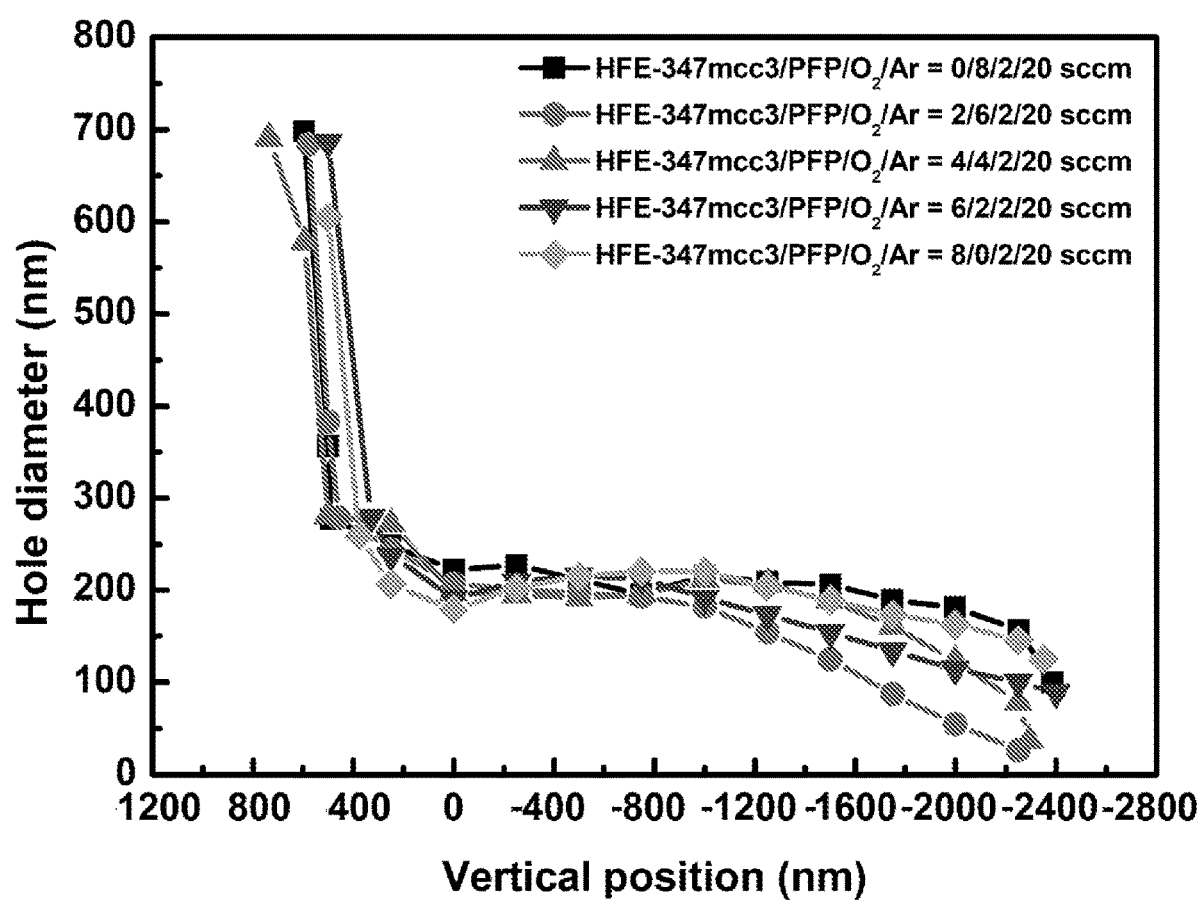
FIG. 7B is a graph measuring the change in a hole diameter along a vertical depth of each of the specimens in FIG. 7A.

FIG. 7A are cross-sectional scanning electron microscope (SEM) images of specimens obtained by plasma-etching a silicon oxide layer using a 200 nm diameter hole-patterned ACL mask for 12 minutes respectively using plasmas generated from discharge gases in which ratios of the flow rates of HFE-347mcc3/PFP/$O_2$/Ar is 0/8/2/20, 2/6/2/20, 4/4/2/20, 6/2/2/20, and 8/0/2/20, respectively. FIG. 7B is a graph measuring the change in a hole diameter along a vertical depth of each of the specimens in FIG. 7A.

TABLE 6

| Source power (W) | Bias voltage (V) | Discharge Gas (X/Y/Z) | Total flow rate (sccm) | Pressure (mTorr) | Substrate temperature (° C.) | Etching time (min) |
|---|---|---|---|---|---|---|
| 250 | −1200 | HFE-347mcc3/PFP/O$_2$/Ar | total = 30 | 10 | 15 | 12 |

Referring to FIG. 7A and FIG. 7B, it may be identified that in a similar manner to the specimens shown in FIG. 6A and FIG. 6B, in the specimens obtained by the etching using the discharge gas in which the ratio of flow rates of HFE-347mcc3/PFP/O$_2$/Ar is 0/8/2/20 and 8/0/2/20, the uniformity of the diameter along the vertical depth of the hole is improved compared to that in the specimens as shown in FIG. 5A and FIG. 5B, whereas in the specimens obtained by the etching using the discharge gas in which the ratio of flow rates of HFE-347mcc3/PFP/O$_2$/Ar is 2/6/2/20, 4/4/2/20, and 6/2/2/20, the uniformity of the diameter along the vertical depth of the hole is significantly lowered compared to that in the specimens as shown in FIG. 5A and FIG. 5B.

Figure 8:
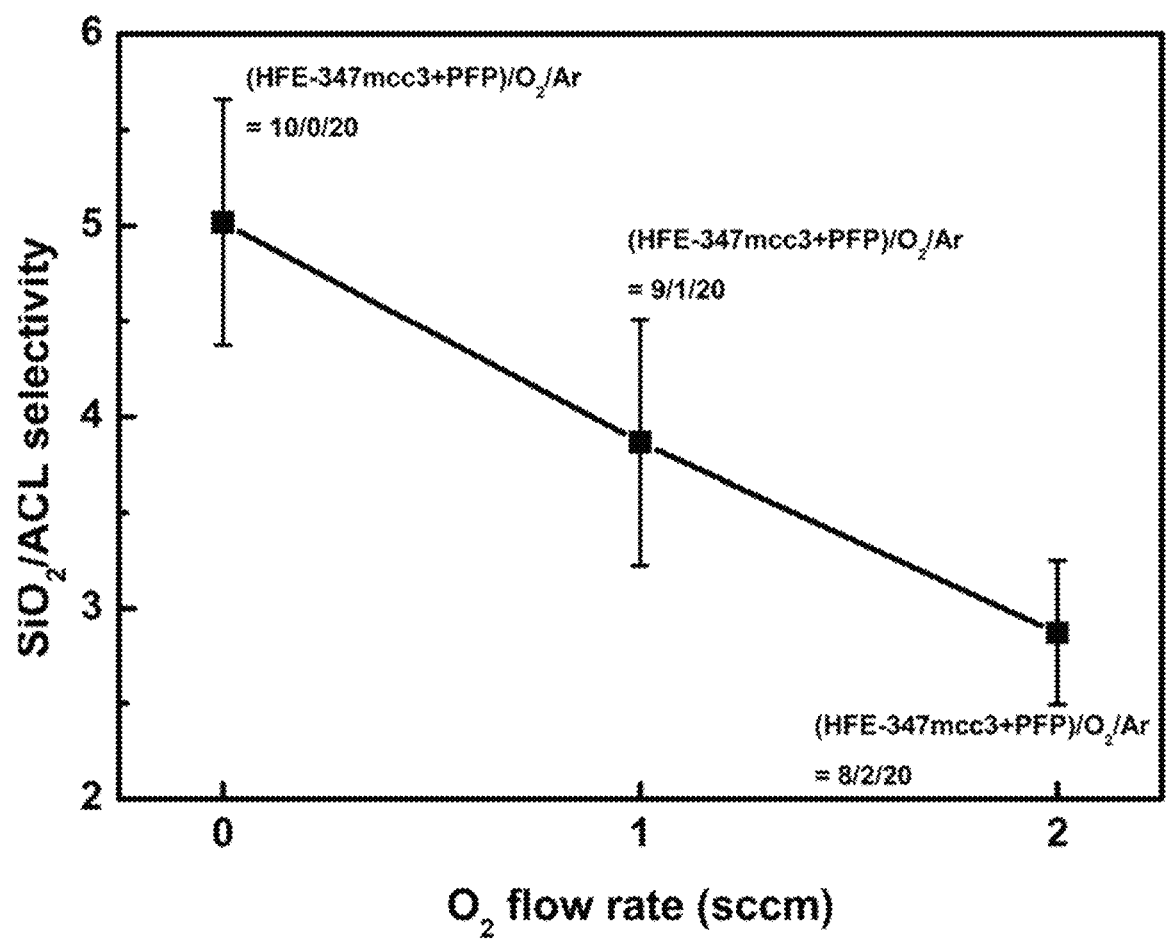
FIG. 8 shows the $SiO_2$/ACL etch selectivity based on a $O_2$ flow rate in the discharge gas of HFE-347mcc3/PFP/$O_2$/Ar.

FIG. 8 shows the SiO$_2$/ACL etch selectivity based on a O$_2$ flow rate in the discharge gas of HFE-347mcc3/PFP/O$_2$/Ar.

Referring to FIG. 8, it may be identified that the SiO$_2$/ACL etch selectivity decreases as the flow rate of the added 02 increases. Specifically, it may be identified that when the etching is performed using the plasma using HFE-347mcc3/PFP/Ar 5/5/20 sccm and 7.5/2.5/20 sccm discharge gas containing both HFE-347mcc3 and PFP and free of O$_2$, the etching profile is straighter and more vertical, and there is no change in the hole diameter, and the SiO$_2$/ACL etching selectivity is higher, compared to those when etching is performed using the plasma using the discharge gas containing only HFE-347mcc3 or PFP. Therefore, when using the plasma using the discharge gas HFE-347mcc3/PFP/Ar 5/5/20 sccm to 7.5/2.5/20 sccm, the SiO$_2$/ACL etch selectivity is higher than that when using the plasma using the O$_2$-containing discharge gas, enabling the higher aspect ratio etching, such that an excellent etched structure having a small diameter change can be formed.

Although the present disclosure has been described with reference to preferred embodiments of the present disclosure, those skilled in the art will understand that various modifications and changes may be made to the present disclosure without departing from the spirit and scope of the present disclosure as described in the claims below.

What is claimed is:

1. A plasma etching method comprising:
   a first step of vaporizing liquid heptafluoropropyl methyl ether (HFE-347mcc3) and liquid pentafluoropropanol (PFP);
   a second step of supplying a discharge gas containing the vaporized HFE-347mcc3, the vaporized PFP, and argon gas to a plasma chamber in which an etching target is disposed; and
   a third step of discharging the discharge gas to generate plasma and plasma-etching the etching target using the generated plasma.

2. The plasma etching method of claim 1, wherein in order to vaporize the liquid HFE-347mcc3 and the liquid PFP and then supply the vaporized HFE-347mcc3 and the vaporized PFP to the plasma chamber,
   a first container receiving the liquid HFE-347mcc3 therein is heated to a first temperature higher than or equal to a boiling point of the HFE-347mcc3, and a first connection pipe connecting the first container and the plasma chamber to each other is heated to a second temperature higher than the first temperature, and
   a second container receiving the liquid PFP therein is heated to a third temperature higher than or equal to a boiling point of the PFP, and a second connection pipe connecting the second container and the plasma chamber to each other is heated to a fourth temperature higher than the third temperature.

3. The plasma etching method of claim 1, wherein a ratio of a flow rate of HFE-347mcc3 to a sum of flow rates of HFE-347mcc3 and PFP in the discharge gas is in a range of 37.5% to 75%.

4. The plasma etching method of claim 3, wherein a ratio of the sum of the flow rates of the HFE-347mcc3 and the PFP and a flow rate of the argon gas is in a range of 1:1 to 1:3.

5. The plasma etching method of claim 1, wherein the etching target is a silicon nitride film formed on a polysilicon substrate,
   wherein a ratio of a flow rate of the HFE-347mcc3 to a sum of flow rates of the HFE-347mcc3 and the PFP in the discharge gas is in a range of 37.5% to 75%,
   wherein a ratio of the sum of the flow rates of the HFE-347mcc3 and the PFP and a flow rate of the argon gas is in a range of 1:1 to 1:3,
   wherein a bias voltage applied to a substrate supporting the etching target thereon is in a range of −500 V to −350 V.

* * * * *